United States Patent
Cheng et al.

(10) Patent No.: US 8,471,356 B2
(45) Date of Patent: Jun. 25, 2013

(54) PROGRAMMABLE ANTI-FUSE STRUCTURES WITH CONDUCTIVE MATERIAL ISLANDS

(75) Inventors: Kangguo Cheng, Guilderland, NY (US); Louis L. Hsu, Fishkill, NY (US); William R. Tonti, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 12/761,780

(22) Filed: Apr. 16, 2010

(65) Prior Publication Data
US 2011/0254121 A1 Oct. 20, 2011

(51) Int. Cl.
*G06F 17/50* (2006.01)
*H01L 21/768* (2006.01)
*H01L 23/525* (2006.01)

(52) U.S. Cl.
USPC ............ 257/530; 257/E21.591; 257/E23.147; 438/467; 438/600; 716/136

(58) Field of Classification Search
USPC ........... 257/530, E21.591, E23.147; 438/467, 438/600; 716/136
See application file for complete search history.

(56) References Cited

U.S. PATENT DOCUMENTS

| | | | |
|---|---|---|---|
| 5,789,795 A | 8/1998 | Sanchez et al. | |
| 6,124,194 A | 9/2000 | Shao et al. | |
| 6,251,710 B1 | 6/2001 | Radens et al. | |
| 6,335,228 B1 | 1/2002 | Fuller et al. | |
| 2005/0285096 A1* | 12/2005 | Kozicki | 257/3 |
| 2006/0073642 A1* | 4/2006 | Yeh et al. | 438/132 |
| 2008/0157269 A1* | 7/2008 | Wong et al. | 257/529 |
| 2008/0157851 A1* | 7/2008 | Aipperspach et al. | 327/525 |
| 2008/0283964 A1* | 11/2008 | Yang et al. | 257/530 |
| 2008/0296728 A1* | 12/2008 | Yang et al. | 257/530 |

* cited by examiner

*Primary Examiner* — Davienne Monbleau
*Assistant Examiner* — Whitney T Moore
(74) *Attorney, Agent, or Firm* — Scully, Scott, Murphy & Presser, P.C.; Anthony J. Canale (57) ABSTRACT

Voltage programmable anti-fuse structures and methods are provided that include at least one conductive material island atop a dielectric surface that is located between two adjacent conductive features. In one embodiment, the anti-fuse structure includes a dielectric material having at least two adjacent conductive features embedded therein. At least one conductive material island is located on an upper surface of the dielectric material that is located between the at least two adjacent conductive features. A dielectric capping layer is located on exposed surfaces of the dielectric material, the at least one conductive material island and the at least two adjacent conductive features. When the anti-fuse structure is in a programmed state, a dielectric breakdown path is present in the dielectric material that is located beneath the at least one conductive material island which conducts electrical current to electrically couple the two adjacent conductive features.

17 Claims, 5 Drawing Sheets

PROGRAMMABLE ANTI-FUSE STRUCTURES WITH CONDUCTIVE MATERIAL ISLANDS

BACKGROUND

The present invention relates to programmable anti-fuse structures as well as methods of fabricating the same. More particularly, the present invention relates to voltage programmable anti-fuse structures including at least one conductive material island atop a dielectric surface that is located between two adjacent conductive features as well as methods of fabricating and programming the same. The present invention also relates to a design structure including such voltage programmable anti-fuse structures.

The manufacture of integrated circuits (ICs) typically includes the formation of metallization layers which are patterned to provide interconnection between devices. Some IC interconnections are programmable, either with fuses or anti-fuses. Non-programmed fuses provide a low resistance link between or within metallization layers which can be programmed by being blown. That is, the fuse can be caused to be non-conductive by applying a sufficiently high current across it to blow.

Anti-fuses operate in the opposite fashion, i.e., the non-programmed structure used to form the anti-fuse has an intrinsically high resistance, and the programmed structure has a relatively low resistance. By applying a programmable current, the electrical resistance through the anti-fuse material is greatly reduced providing a conductive link between or within metallization levels. Programming of typical anti-fuse structures can be accomplished by providing a voltage of 4-10 volts between the metal layers. Before programming, the anti-fuse structure typically has a resistance of above 1 giga-ohm for a 1 µm diameter via. A programmed anti-fuse forms a conductive path between the metal layers having a resistance of about 20-100 ohms.

Anti-fuse structures allow for much higher programmable interconnection densities than standard fuse structures as well as smaller current and power for the non-programmed elements. Anti-fuse structures have been used in the semiconductor industry for memory related applications, such as, for example, field programmable gate arrays and programmable read-only memories. As indicated above, anti-fuse structures include a material which initially has a high resistance but can be converted into a lower resistance by performing a certain application. For example, an unprogrammed anti-fuse type gate array can be programmed by causing a selected anti-fuse type to become conductive.

Prior art processing for integrating voltage programmable anti-fuse structures into existing semiconductor structures however require many extra masking and etching steps which increase overall fabrication costs. Moreover, prior art voltage programmable anti-fuse structures exhibit poor reliability. That is, since the programming voltage for creating the electrical path is a function of the thickness of the anti-fuse material layer, the anti-fuse material damage resulting from dielectric over-etching can cause deprogrammed states and result in product failure. Also, the design of prior art voltage programmable anti-fuse structures is limited since the voltage programming methods requires a sandwich structure with a layer of anti-fuse material in between two 'disconnected' conductive materials. This required design limitation of prior art voltage programmed anti-fuse structures limits the design flexibility and enlarges the area required for forming the anti-fuse element.

SUMMARY

Anti-fuse structures and methods are provided that include at least one conductive material island atop a dielectric surface that is located between two adjacent conductive features. In one embodiment, the two adjacent conductive features are laterally adjacent conductive features. Such anti-fuse structures do not include an extra layer of an anti-fuse material that is sandwiched between top and bottom conductive layers as is the case in prior art voltage programmable anti-fuse structures.

In one embodiment, the anti-fuse structure includes a dielectric material having at least two adjacent conductive features embedded therein. In some embodiments, the two adjacent conductive features are laterally adjacent to each other, wherein an upper surface of each of the at least two laterally adjacent conductive features is coplanar with an upper surface of the dielectric material. At least one conductive material island is located on an upper surface of the dielectric material that is located between the at least two adjacent conductive features. A dielectric capping layer can be located on exposed surfaces of the dielectric material, the at least one conductive material island and the at least two adjacent conductive features. When the anti-fuse structure is in a programmed state, a dielectric breakdown path is present in the dielectric material (typically within an upper surface of the dielectric material) that is located beneath the at least one conductive material island which conducts electrical current to electrically couple the two adjacent conductive features.

In yet another embodiment of the invention, a structure is provided that includes at least one interconnect region and at least one laterally adjacent anti-fuse region located at a same interconnect level. The at least one laterally adjacent anti-fuse region of the structure includes an anti-fuse structure. The anti-fuse structure includes a dielectric material having at least two adjacent, typically laterally adjacent, conductive features embedded therein. When two laterally adjacent conductive features are present, an upper surface of each of the at least two laterally adjacent conductive features is coplanar with an upper surface of the dielectric material. The anti-fuse structure further includes at least one conductive material island located on an upper surface of the dielectric material between the at least two adjacent conductive features. The anti-fuse structure of this embodiment may further include a dielectric capping layer located on exposed surfaces of the dielectric material, the at least one conductive material island and the at least two adjacent conductive features. When the anti-fuse structure of this embodiment is in a programmed state, a dielectric breakdown path is present in the dielectric material (typically in an upper surface thereof) that is located beneath the at least one conductive material island which conducts electrical current to electrically couple the two adjacent conductive features.

The present invention also provides a design structure tangibly embodied in a machine readable medium for designing, manufacturing, or testing an integrated circuit. In one embodiment, the design structure includes a dielectric material having at least two adjacent, typically laterally adjacent, conductive features embedded therein. In embodiments in which two laterally adjacent conductive features are employed, an upper surface of each of the at least two laterally adjacent conductive features is coplanar with an upper surface of the dielectric material. The design structure further includes at least one conductive material island located on an upper surface of the dielectric material between the at least two adjacent conductive features and a dielectric capping layer located on exposed surfaces of the dielectric material, the at least one conductive material island and the at least two adjacent conductive features.

In another embodiment of the invention, the design structure includes at least one interconnect region and at least one laterally adjacent anti-fuse region located at a same interconnect level, wherein the at least one laterally adjacent anti-fuse region includes an anti-fuse structure. The anti-fuse structure within the design structure includes a dielectric material having at least two adjacent, typically laterally adjacent, conductive features embedded therein. In embodiments in which two laterally adjacent conductive features are employed, an upper surface of each of the at least two laterally adjacent conductive features is coplanar with an upper surface of the dielectric material. The anti-fuse structure further includes at least one conductive material island located on an upper surface of the dielectric material and between the at least two adjacent conductive features, and a dielectric capping layer located on exposed surfaces of the dielectric material, the at least one conductive material island and the at least two adjacent conductive features.

The present invention also provides methods of forming anti-fuse structures as mentioned above. In one embodiment of the invention, a method is provided that includes forming a dielectric material having at least two adjacent conductive features that are electrically and physically isolated from each other. In some embodiments, the two adjacent conductive features are laterally adjacent conductive features, wherein an upper surface of each of the at least two laterally adjacent conductive features is coplanar with an upper surface of the dielectric material. At least one conductive material island is formed on an upper surface of the dielectric material between the at least two adjacent conductive features. A dielectric capping layer is formed on exposed surfaces of the dielectric material, the at least one conductive material island and the at least two adjacent conductive features. A voltage, typically from 0.1 volts to 10 volts, can then be applied to the anti-fuse structure to program the same. In particular, the applied voltage causes a dielectric breakdown path to form in the dielectric material, typically within an upper surface thereof, that is located beneath the at least one conductive material island which conducts electrical current to electrically couple the two adjacent conductive features.

Another method is provided that includes forming a dielectric material having at least one interconnect region and at least one anti-fuse region, wherein the at least one anti-fuse region includes at least two adjacent conductive features that are embedded within a dielectric material and are electrically and physically isolated from each other. In some embodiments, the two adjacent conductive features are laterally adjacent conductive features, wherein an upper surface of each of the at least two laterally adjacent conductive features is coplanar with an upper surface of the dielectric material. A block mask is formed within the at least one interconnect region, while leaving the at least one anti-fuse region exposed. At least one conductive material island is then formed on an upper surface of the dielectric material between the at least two adjacent conductive features in the at least one anti-fuse region. The block mask is thereafter removed from the at least one interconnect region, and a dielectric capping layer is formed within both the at least one interconnect region and the at least one anti-fuse region. A voltage can be optionally applied to the structure which causes a dielectric breakdown path to form in the dielectric material (typically within an upper surface thereof) that is located beneath the at least one conductive material island which conducts electrical current to electrically couple the two adjacent conductive features within the at least one anti-fuse region.

In addition to the above, the present invention also provides a method of programming an anti-fuse structure. The method includes providing an anti-fuse structure including a dielectric material having at least two adjacent conductive features embedded therein, at least one conductive material island located on the upper surface of the dielectric material between the at least two adjacent conductive features, and a dielectric capping layer located on exposed surfaces of the dielectric material, the at least one conductive material island and the at least two adjacent conductive features; and applying a voltage to the anti-fuse structure, wherein the voltage causes a dielectric breakdown path to form in the dielectric material that is located beneath the at least one conductive material island which conducts electrical current to electrically couple the two adjacent conductive features.

DETAILED DESCRIPTION

The present invention, which provides anti-fuse structures including at least one conductive material island atop a dielectric surface between two adjacent conductive features and methods of fabricating and programming the same, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present invention. However, it will be appreciated by one of ordinary skill in the art that various embodiments of the invention may be practiced without these, or with other, specific details. In other instances, well-known structures or processing steps have not been described in detail in order to avoid obscuring the various embodiments of the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
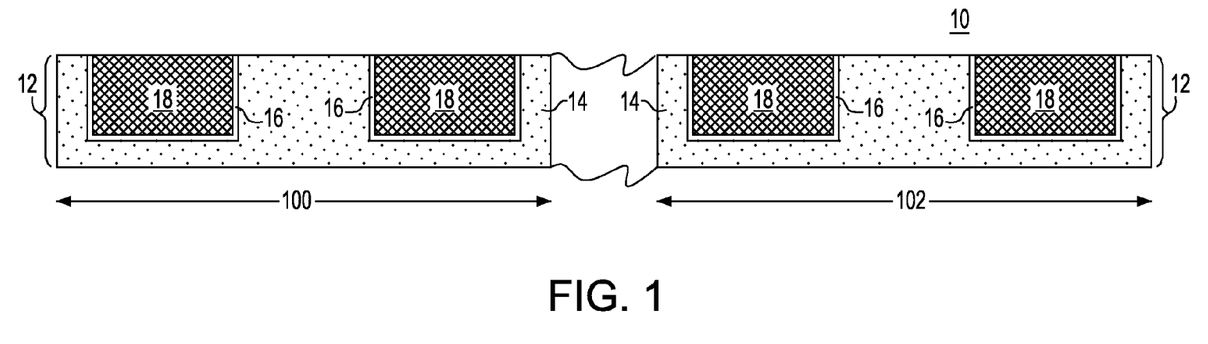
FIG. 1 is a pictorial representation (through a cross sectional view) depicting an initial structure including an interconnect level comprising at least one interconnect region and at least one laterally adjacent anti-fuse region that can be employed in one embodiment of the invention.
Figure 2:
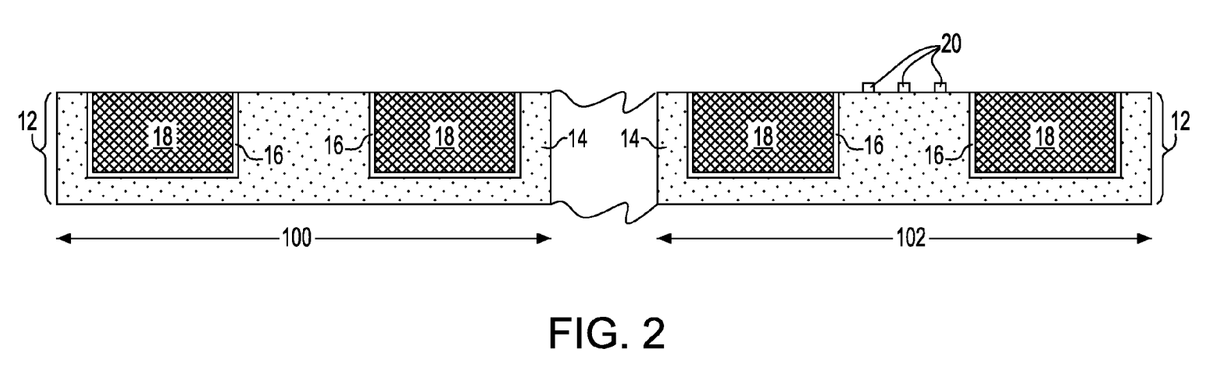
FIG. 2 is a pictorial representation (through a cross sectional view) depicting the structure of FIG. 1 after forming at least one conductive material island on an exposed surface of a dielectric material that is located between two adjacent conductive features within the at least one anti-fuse region of the structure in accordance with one embodiment of the invention.
Figure 3:
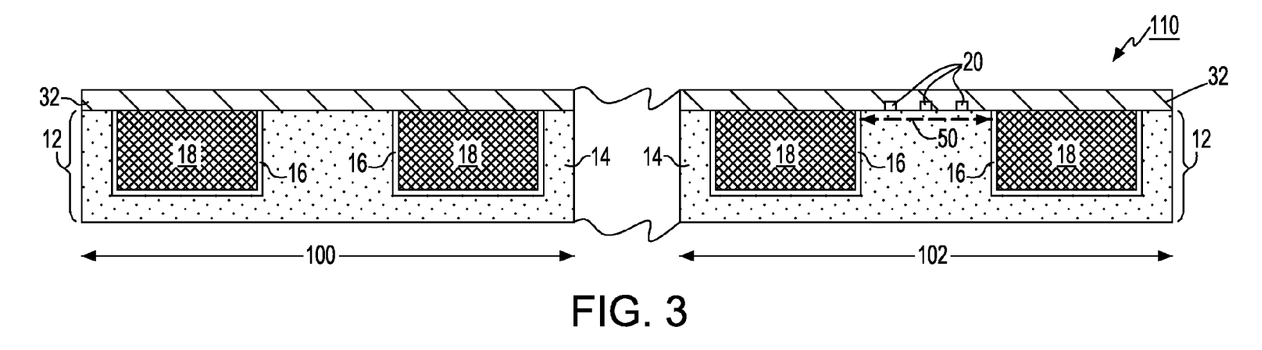
FIG. 3 is a pictorial representation (through a cross sectional view) depicting the structure of FIG. 2 after forming a dielectric capping layer on the exposed surfaces in both the at least one interconnect region and the at least one anti-fuse region of the structure.

Reference is now made to FIGS. 1-3 which illustrate basic processing steps that can be employed in one embodiment of the present invention. Specifically, the processing employed in this embodiment of the invention can begin with providing an initial structure 10 such as shown in FIG. 1 which includes an interconnect level 12. Interconnect level 12, which may be considered as a first or lower interconnect level, includes at least one interconnect region 100 and at least one laterally adjacent anti-fuse region 102. Interconnect level 12 comprises a dielectric material 14 having a plurality of conductive features (i.e., conductive regions) 18 therein. Each of the conductive features 18 are separated from the dielectric material 14 by a barrier layer 16. The number of conductive features 18 within the at least one interconnect region 100 and the at least one anti-fuse region 102 may vary so long as there are at least two adjacent conductive features 18 located within the at least one anti-fuse region 102 of the initial structure 10. The two adjacent conductive features can be laterally adjacent conductive features or vertically adjacent conductive features. It is observed that the at least one interconnect region 100 and the at least one anti-fuse region 102 are located within the same interconnect level of the initial structure 10 and they are separated by portions of dielectric material 12. The pair of wiggly lines in each of the drawings represents a region of the dielectric material 12 that separates the at least one interconnect region 100 from the at least one anti-fuse region 102.

The initial structure 10 shown in FIG. 1 can be made utilizing conventional techniques well known to those skilled in the art. For example, the initial structure 10 can be formed by first applying dielectric material 14 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof such as by multilayers. When the substrate is a conducting material, the substrate may include, for example, polySi, an elemental metal, alloys of elemental metals, a metal silicide, a metal nitride or combinations thereof such as by multilayers. When the substrate comprises a semiconducting material, one or more semiconductor devices such as, for example, complementary metal oxide semiconductor (CMOS) devices can be fabricated thereon.

The dielectric material 14 of interconnect level 12 may comprise any interlevel or intralevel dielectric including inorganic dielectrics or organic dielectrics. The dielectric material 14 may be porous or non-porous, with porous dielectrics having a dielectric constant of about 2.8 or less being preferred in some embodiments of the present invention. Some examples of suitable dielectrics that can be used as the dielectric material 14 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 14 typically has a dielectric constant that is about 4.0 or less, with a dielectric constant of about 2.8 or less being more typical. These dielectrics generally have a lower parasitic crosstalk as compared with dielectric materials that have a higher dielectric constant than 4.0, The thickness of the dielectric material 14 may vary depending upon the type of dielectric material used as well as the exact number of dielectrics within interconnect level 12. Typically, and for normal interconnect structures, the dielectric material 14 has a thickness from 200 nm to 450 nm.

At least one portion of dielectric material 14 is preselected to become the interconnect region 100, i.e., a region in which interconnect structures are to be subsequently formed, while at least one other portion of dielectric material 14 is preselected to become the anti-fuse region 102, i.e., a region in which anti-fuse structures are to be subsequently formed.

As mentioned above, interconnect level 12 has a plurality of conductive features 18 within each of the regions, i.e., the at least one interconnect region 100 and the at least one anti-fuse region 102, that are embedded in (i.e., located within) the dielectric material 14. Each of the conductive features 18 comprises a conductive material that is separated from the dielectric material 14 by a barrier layer 16. The plurality of conductive features 18 are formed by lithography (i.e., applying a photoresist to the surface of the dielectric material 14, exposing the photoresist to a desired pattern of radiation, and developing the exposed resist utilizing a conventional resist developer), etching (dry etching or wet etching) a plurality of openings in the dielectric material 14 and filling the etched plurality of openings with the barrier layer 16 and then with a conductive material forming conductive features 18. The barrier layer 16, which may comprise Ta, TaN, Ti, TiN, Ru, RuN, W, WN, Co or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 16 may vary depending on the exact type of deposition process and/or are diffusion barrier material employed. Typically, the barrier layer 16 has a thickness from 4 nm to 40 nm, with a thickness from 7 nm to 20 nm being more typical.

Following the barrier layer 16 formation, the remaining region of each of the openings within the dielectric material 14 is filled with a conductive material forming the conductive features 18. The conductive material used in forming the conductive features 18 includes, for example, polySi, a conductive metal, an alloy comprising at least one conductive metal, a conductive metal silicide or combinations thereof Preferably, the conductive material that is used in forming each of the conductive features 18 is a conductive metal such as Cu, W or Al, with Cu or a Cu alloy (such as AlCu) being highly preferred in the present invention. The conductive material is filled into each of the remaining openings in the dielectric material 14 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 16 and the conductive feature 18 in each of the openings have an upper surface that is substantially coplanar with the upper surface of the dielectric material 14.

Referring now to FIG. 2, there is illustrated the structure of FIG. 1 after forming at least one conductive material island 20 on at least an upper exposed surface of the dielectric material 14 that is located between two adjacent conductive features 18 within the at least one anti-fuse region 102. The at least one conductive material island 20 is formed by providing a block mask (not shown) atop the structure within the at least one interconnect region 100, while leaving the structure within the at least one anti-fuse region 102 exposed. The block mask, which is not shown, may include a hard mask, a photoresist or a multilayered stack thereof. In one embodiment, the block mask is a photoresist. In another embodiment, the block mask is a hard mask selected from a semiconductor oxide, semiconductor nitride, or semiconductor oxynitride.

The block mask may be formed utilizing conventional techniques, including a technique that utilizes deposition, photolithography and optionally etching, that are well known to those skilled in the art. In particular, and when the patterned mask is comprised solely of a photoresist, a blanket layer of photoresist material is first applied to the upper surface of the dielectric material 14 within both the at least one interconnect region 100 and the at least one anti-fuse region 102 utilizing a conventional deposition process such as, for example, spin-on coating, evaporation, chemical vapor deposition (CVD), and plasma enhanced chemical vapor deposition (PECVD). After deposition of the blanket layer of photoresist, the blanket layer may be patterned by lithography including exposing the photoresist to a desired pattern of radiation and developing the exposed resist utilizing a conventional resist developer.

When a hard mask is used as the block mask, a blanket layer of hard mask material may be first deposited on the surface of the dielectric material 14 in both the at least one interconnect region 100 and the at least one anti-fuse region 102 utilizing a conventional deposition process including, for example, CVD, PECVD, chemical solution deposition, evaporation, atomic layer deposition (ALD), or physical vapor deposition (PVD). A blanket layer of photoresist may be applied atop the blanket layer of hard mask material, and thereafter lithography may be used to pattern the photoresist. The pattern within the patterned resist may be transferred to the underlying hard mask material utilizing one of dry etching (reactive ion etching, ion beam etching, plasma etching, or laser ablation) and chemical wet etching. The patterned resist is optionally removed from the structure following the pattern transfer step utilizing a conventional resist stripping process well known to those skilled in the art. Alternatively, the patterned resist can remain atop the pattern hard mask and form a multilayered patterned mask.

With the block mask protecting the at least one interconnect region 100 of the initial structure 10 shown in FIG. 1, the at least one conductive material island 20 is "discontinuously" formed atop at least the exposed surfaces of the dielectric material 14 that is located between the two adjacent conductive features 18 by utilizing a deposition process such as, for example, chemical vapor deposition (CVD), plasma enhanced chemical vapor deposition (PECVD), atomic layer deposition (ALD), electroplating and electroless plating. In some embodiments of the invention (not shown in FIG. 2), a layer of conductive material can be formed atop the exposed surface of the conductive features 18 within the at least one anti-fuse region 102. In such an embodiment, the layer of conductive material that is formed atop the conductive features 18 can be a continuous layer or a discontinuous layer depending on the deposition conditions employed as well as the deposition rate of the conductive material on the surface of the conductive features 18 compared to the deposition rate of the conductive material on the surface of dielectric material 14.

Each island 20 that is formed is comprised of a conductive material that has a higher resistance to oxidation and diffusion than the conductive material of the conductive features. In one embodiment of the invention, each island 20 is comprised of a noble metal. The term "noble metal" denotes any metal that is resistant to corrosion and oxidation in moist air, unlike most base metal. Noble metals tend to be precious, often due to their rarity in the Earth's crust. The noble metals that can be employed in the present application include, but are not limited to ruthenium (Ru), rhodium (Rh), palladium (Pd), silver (Ag), osmium (Os), iridium (Ir), platinum (Pt), gold (Au) and cobalt (Co). In one embodiment of the invention, each of the conductive material islands 20 is comprised of Ru, Ir, Co or Rh. In yet another embodiment of the invention, each of the conductive material islands 20 is comprised of nitrogen (N), phosphorus (P), boron (B) or tungsten (W).

The height of each of the conductive material islands 20 that is formed may vary depending on the technique that was employed in forming the conductive material islands as well as the material used in forming the same. Typically, the height of each of the conductive material islands 20 is from 1 Å to 20 Å, with a height from 2 Å to 5 Å being more typical. The spacing between each of the conductive material islands 20 that is formed atop the dielectric material 14 is not critical so long as a continuous layer of conductive material is not formed.

After formation of the at least one conductive material island 20, the block mask is typically removed from the at least one interconnect region 100 utilizing a conventional technique well known in the art including, for example, resist stripping by ashing, and/or chemical mechanical planairization.

Referring now to FIG. 3, there is illustrated the structure of FIG. 2 after forming a dielectric capping layer 32 on all exposed surfaces within the at least one interconnect region 100 and the at least one anti-fuse region 102. As shown, the dielectric capping layer 32 within the at least one interconnect region 100 is located atop exposed surfaces of dielectric material 14, exposed surfaces of barrier layer 16 and exposed surfaces of conductive features 18, while the dielectric capping layer 32 within the at least one anti-fuse region 102 is located atop exposed surfaces of dielectric material 12, exposed surfaces of barrier layer 16, exposed surfaces of conductive features 18 and exposed surfaces of the at least one conductive material island 20.

The dielectric capping layer 32 that is employed in the present invention can be formed utilizing a conventional deposition process such as, for example, CVD, PECVD, chemical solution deposition, or evaporation. The dielectric capping layer 32 that is employed in the present invention includes any suitable dielectric capping material such as, for example, SiC, Si$_4$NH$_3$, SiO$_2$, a carbon doped oxide, a nitrogen and hydrogen doped silicon carbide SiC(N,H) or multilayers thereof. The thickness of the dielectric capping layer 32 may vary depending on the technique used to form the same as well as the material make-up of the layer. Typically, the dielectric capping layer 32 has a thickness from 15 to 55 nm, with a thickness from 25 to 45 nm being more typical.

It is observed that FIG. 3 illustrates one possible anti-fuse structure 110 of the present application. The anti-fuse structure 110 includes dielectric material 14 that has at least two adjacent conductive features 18 embedded therein. In embodiments in which the two adjacent conductive features 18 are laterally adjacent, the upper surfaces of the conductive features 18 are coplanar with an upper surface of dielectric material 14. The anti-fuse structure 110 also includes at least one conductive material island 20 atop an exposed surface of dielectric material 14 that is located between the two adjacent conductive features 18. The presence of the at least one conductive material island 20 atop the dielectric material 14 that is located between the two adjacent conductive features 18 assists in breaking down the dielectric material 14 when the anti-fuse structure is programmed by applying a voltage thereto. A dielectric capping layer 32 is located on the exposed surfaces of the dielectric material 14, the two adjacent conductive features 18 and the at least one conductive material island 20. When the anti-fuse structure 110 shown in FIG. 3 is programmed or is in a programmed state, current travels from one of the adjacent conductive features to the other adjacent conductive feature through a dielectric breakdown path that exists in the dielectric material 14 (typically within an upper surface thereof) that includes the overlying at least one conductive material island 20. The dotted line 50 shown in FIG. 3 represents the dielectric breakdown path that is formed when the anti-fuse structure 110 shown in FIG. 3 is programmed or is in a programmed state. The dielectric breakdown path 50 conducts electrical current to electrically couple the two adjacent conductive features 18 within the anti-fuse structure 110 which are otherwise electrically and physically isolated before programming and remain physically isolated after programming.

Figure 4:
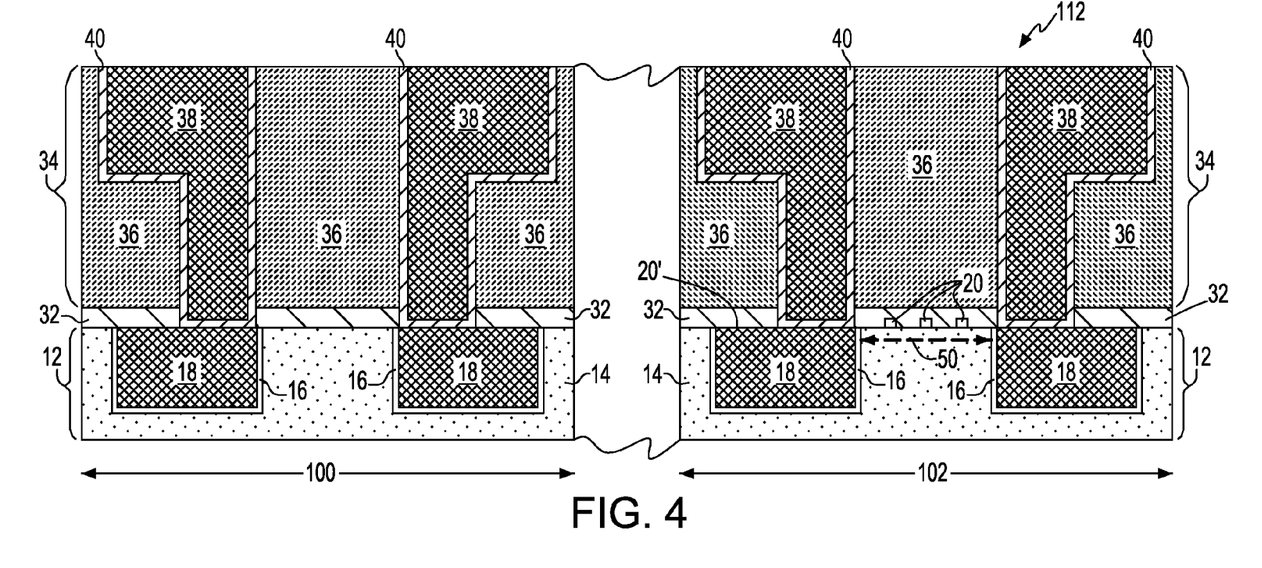
FIG. 4 is a pictorial representation (through a cross sectional view) depicting the structure of FIG. 3 after optionally forming a second interconnect level atop the interconnect level shown in FIGS. 1-3.

Reference is now made to FIG. 4, which represents an optional embodiment of the invention in which a second, i.e., upper, interconnect level 34 is formed atop the structure shown in FIG. 3. The second interconnect level 34 shown in FIG. 4 includes a second dielectric material 36 that has a plurality of conductively filled regions 38 embedded therein. The plurality of conductively filled regions 38, which may also be referred to as conductive features as well, can include conductively filled vias, conductively filled lines or a combination of conductively filled vias and conductively filled lines. FIG. 4 shows an embodiment in which the plurality of conductively filled regions 38 are represented as a plurality of conductively filled vias and a plurality of overlying and electrically connective conductively filled lines. The plurality of conductively filled regions 38 may be separated from the second dielectric material 36 by a diffusion barrier liner 40.

The second interconnect level 34 which can be optionally formed in one embodiment may be formed by first applying a second dielectric material 36 to the upper exposed surface of the dielectric capping layer 32 in both the at least one interconnect region 100 and the at least one anti-fuse region 102. The second dielectric material 36 can comprise the same or different, preferably the same, dielectric material as that of dielectric material 14 of interconnect level 12. The processing techniques and thickness ranges for dielectric material 14 are also applicable here for the second dielectric material 36. The second dielectric material 36 can also comprise two different materials, e.g., deposition of one dielectric material first, followed by deposition of a different dielectric material. In one embodiment of the present invention, the second dielectric material 36 comprises two different low k dielectric materials such that the second interconnect level 34 has a hybrid structure with a plurality of conductively filled regions embedded in a porous dielectric material, and a plurality of conductively filled regions embedded in a dense (i.e., non porous) dielectric material. In such an embodiment, the porous low k dielectric may have a dielectric constant of about 2.8 or less, and the dense porous low k dielectric may have a dielectric constant of about 4.0 or less.

A plurality of openings can be formed into the second dielectric material 36 by first forming a blanket hard mask material (not shown) atop the upper surface of the second dielectric material 36. The plurality of one openings may include via openings, line openings or combined via and line openings. The plurality of openings can be formed by a single damascene process or a dual damascene process. Damascene processes typically include at least two iterations of photolithography and etching.

After forming the plurality of openings within the second dielectric material 36, an etching process such as, for example, sputtering or plasma etching, is employed to extend some of the plurality of openings through the underlying dielectric capping layer 32, stopping atop the underlying surface of conductive features 18.

A diffusion barrier liner 40 may be then formed into the plurality of openings. The diffusion barrier liner 40 comprises any material that can serve as a barrier to prevent a conductive material from diffusing there through. Diffusion barrier liner 40 thus may comprise one of the diffusion barrier materials mentioned above for barrier layer 16. Illustratively, the diffusion barrier liner 40 of the conductively filled regions 38 includes a layer or material stack of TaN, Ta, Ti, TIN, RuTa, RuTaN, W, Ru, Co, Rh or Ir or any combination thereof. The diffusion barrier liner 40 may be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier liner 40 may vary depending on the number of material layers within the barrier, the technique used in forming the same, as well as the material of the diffusion barrier itself. Typically, the diffusion barrier liner 40 has a thickness from 4 nm to 40 nm, with a thickness from 7 nm to 20 nm being even more typical. In some embodiments, not shown, a portion of the diffusion barrier liner 40 that is located directly on the exposed surface of the underlying conductive features 18 can be removed by etching processes well known in the art.

In some embodiments of the present invention, a plating seed layer (not shown) may be formed atop the diffusion barrier liner 40. When employed, the plating seed layer may be comprised of a metal or metal alloy from Group VIIIA of the Periodic Table of Elements. Examples of suitable materials for the plating seed layer include, but are not limited to Ru, TaRu, Ir, Rh, Pt, Pd and alloys thereof. In some embodiments, it is preferred to use Ru, Ir or Rh as the plating seed layer. The plating seed layer may be formed by a conventional deposition process including, for example, chemical vapor deposition (CVD), plasma enhanced chemical vapor deposition (PECVD), atomic layer deposition (ALD), plating, sputtering or physical vapor deposition (PVD). The thickness of the plating seed layer may vary depending on number of factors including, for example, the compositional material of the plating seed layer and the technique that was used in forming the same. Typically, the plating seed layer has a thickness from 0.5 nm to 10 nm, with a thickness of less than 6 nm being even more typical.

The plurality of openings within the second dielectric material 36, with or without the plating seed layer, can be filled with an interconnect conductive material and planarized to provide the planarized structure shown in FIG. 4 including the plurality of conductively filled regions 38. The interconnect conductive material employed in forming the plurality of conductively filled regions 38 can comprise the same or different, preferably the same, conductive material as that of the conductive features 18. Preferably, Cu, Al, W or alloys thereof are used, with Cu or AlCu being most preferred. The interconnect conductive material employed in forming the plurality of conductively filled regions 38 may be formed utilizing the same deposition processing as described above in forming the plurality of conductive features 18. Following deposition of the conductive material, the structure may be subjected to planarization.

It is observed that FIG. 4 represents an alternative anti-fuse structure 112 that can be formed in the present invention. The anti-fuse structure 112 includes dielectric material 14 that has at least two adjacent conductive features 18 embedded therein. In some embodiments in which the at least two adjacent conductive features are laterally adjacent to each other, the upper surfaces of the conductive features 18 are coplanar with an upper surface of dielectric material 14. The anti-fuse structure 112 also includes at least one conductive material island 20 atop an exposed surface of dielectric material 14 that is located between the two adjacent conductive features 18. A dielectric capping layer 32 is located on the exposed surfaces of the dielectric material 14, the two adjacent conductive features 18 and the at least one conductive material island 20. A second interconnect level 34 is located atop interconnect level 12. Interconnect level 34 includes a second dielectric material 36 that includes a plurality of conductively filled regions 38 embedded therein. When the anti-fuse structure 112 shown in FIG. 4 is programmed or is in a programmed state, current travels from one of the adjacent conductive features to the other adjacent conductive feature in interconnect level 12 through a dielectric breakdown path that exists in the dielectric material 14 (typically within an upper surface thereof) that includes the overlying at least one conductive material island 20. The dotted line 50 shown in FIG. 4 represents the dielectric breakdown path that is formed when the anti-fuse structure 112 shown in FIG. 4 is programmed or is in a programmed state. The dielectric breakdown path 50 conducts electrical current to electrically couple the two adjacent conductive features 18 within the anti-fuse structure which are otherwise electrically and physically isolated before programming, and remain physically isolated after programming.

Figure 5:
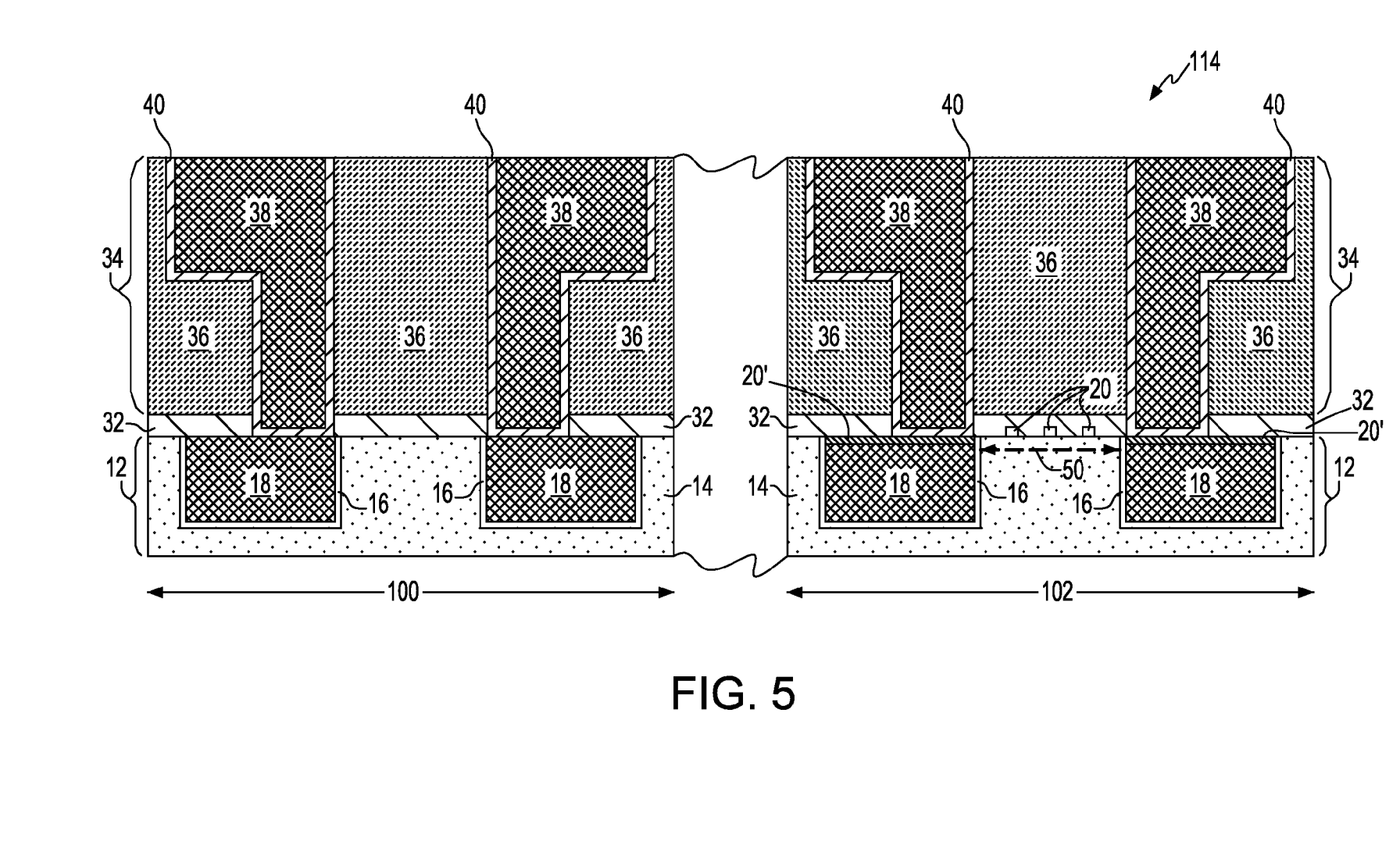
FIG. 5 is a pictorial representation (through a cross sectional view) depicting an alternative structure that can be formed in the present application.

Reference is now made to FIG. 5 which represents another alternative structure 114 that can be formed in the present application. The alternative structure 114 shown in FIG. 5 is similar to the one depicted in FIG. 4 except that the upper surface of the conductive features 18 within the anti-fuse region 102 includes a layer of conductive material 20'. The layer of conductive material 20' can be either continuous or discontinuous. The layer of conductive material 20' is comprised of the same conductive material as the at least one conductive material island 20.

Figure 6:
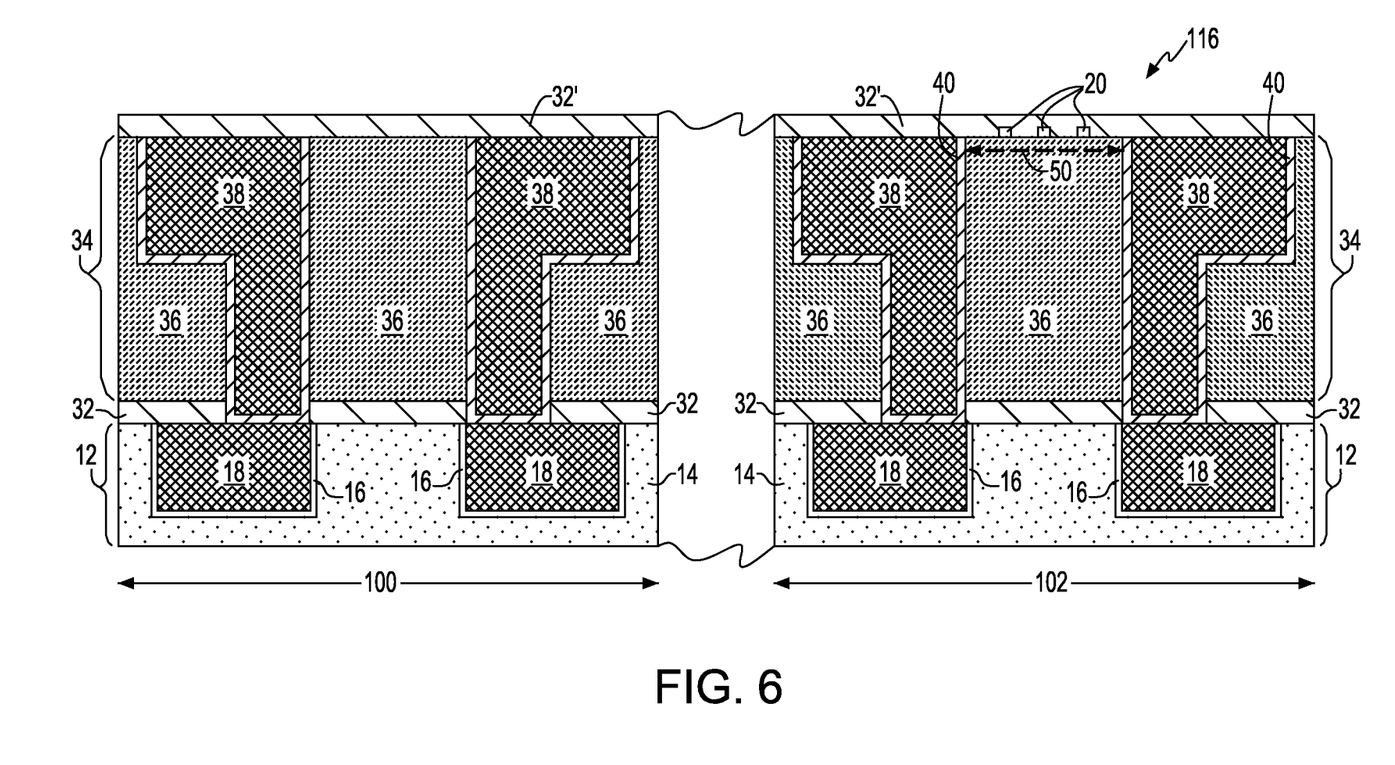
FIG. 6 is a pictorial representation (through a cross sectional view) depicting another alternative structure that can be formed in the present application.

Reference is now made to FIG. 6 which represents yet another alternative anti-fuse structure 116 that can be formed in the present application. The alternative anti-fuse structure 116 is similar to the alternative structure 112 that is shown in FIG. 4 expect that the at least one conductive material island 20 is not formed atop the dielectric material 14 in interconnect level 12. Instead, the at least one conductive material island formation is delayed until after the second interconnect level 34 is formed. Specifically, the basic processing steps shown in FIGS. 1-4 are first performed minus the at least one conductive material island 20 formation. After forming the second interconnect level 34, the at least one conductive material island 20 is formed atop at least the exposed upper surface of the second dielectric material 36 within the at least one anti-fuse region 102. The at least one conductive material island 20 of this embodiment of the invention is formed as described above and it includes one of the conductive materials mentioned above. It is noted that although no layer of conductive material is illustrated atop the upper exposed upper surfaces of each of the conductively filled regions 38 within the anti-fuse region 102, the present invention contemplates such an embodiment. After forming the at least one conductive material island 20 atop a portion of the second dielectric material 36 that is located between the two adjacent conductively filled regions 38, a second dielectric capping layer 32' is formed in each of the regions 100, 102. Second dielectric capping layer 32' includes one of the dielectric capping materials mentioned above for dielectric capping layer 32.

It is observed that FIG. 6 illustrates one possible anti-fuse structure 116 of the present application. Anti-fuse structure 116 includes dielectric material 14 that has at least two adjacent conductive features 18 embedded therein. In some embodiments in which the two adjacent conductive features are laterally adjacent to each other, the upper surfaces of the conductive features 18 are coplanar with an upper surface of dielectric material 14. A dielectric capping layer 32 is located on the exposed surfaces of the dielectric material 12 and the two adjacent conductive features. A second interconnect level 34 is located atop interconnect level 12. The second interconnect level 34 includes a second dielectric material 36 that includes a plurality of conductively filled regions 38 embedded therein. In this embodiment, at least one conductive material island 20 is located atop the second dielectric material 36 between two adjacent conductively filled regions 38 that are present in the second dielectric material 36.

When the anti-fuse structure 116 shown in FIG. 6 is programmed or is in a programmed state, current travels from one of the adjacent conductive regions (i.e., one of the conductively filled regions 38) to the other adjacent conductive region through a dielectric breakdown path that exists in the second dielectric material 36 (typically within an upper surface thereof) that includes the overlying at least one conductive material island 20. The dotted line 50 shown in FIG. 6 represents the dielectric breakdown path that is formed when the anti-fuse structure 116 shown in FIG. 6 is programmed or is in a programmed state. The dielectric breakdown path 50 conducts electrical current to electrically couple the two adjacent conductively filled regions 38 within the anti-fuse structure which are otherwise electrically and physically isolated before programming, and remain physically isolated after programming.

Figure 7:
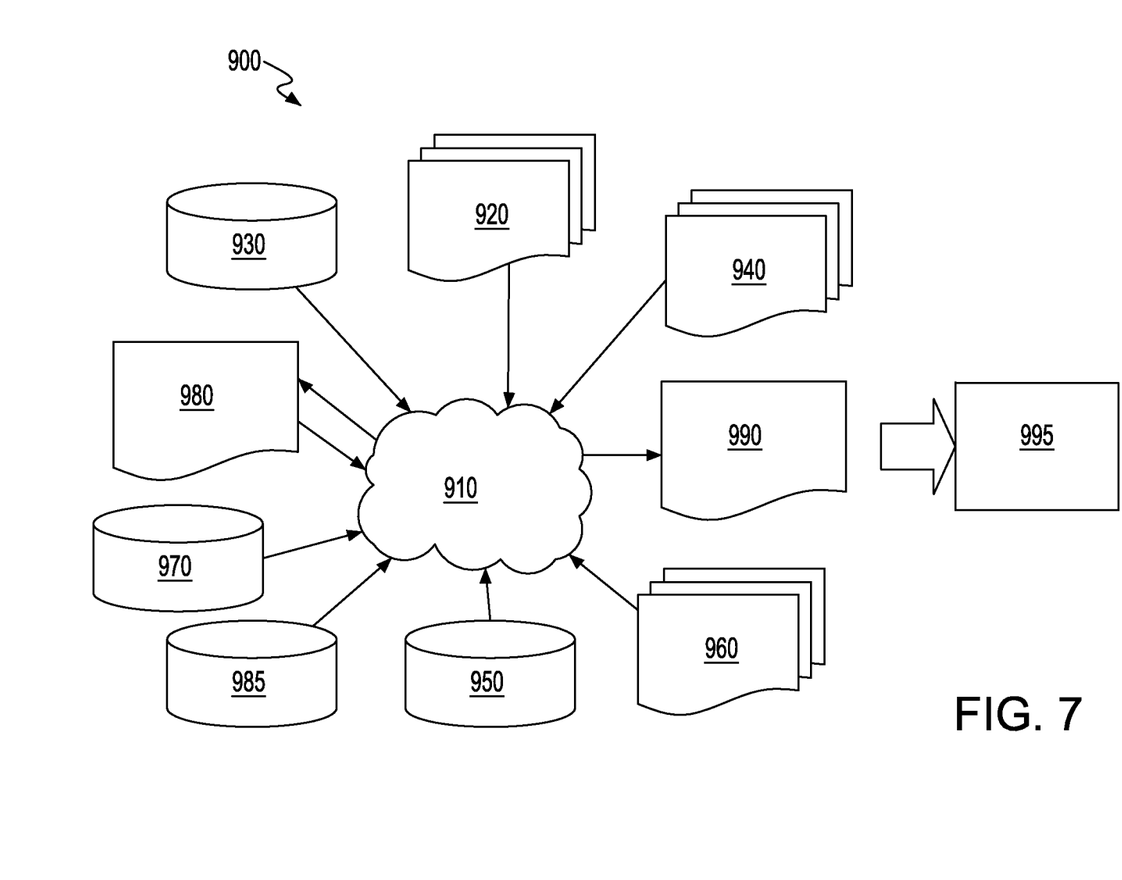
FIG. 7 is a flow diagram of a design process used in semiconductor design, manufacture and/or test.

FIG. 7 shows a block diagram of an exemplary design flow 900 used for example, in semiconductor IC logic design, simulation, test, layout, and manufacture. Design flow 900 includes processes, machines and mechanisms for processing design structures or devices to generate logically or otherwise functionally equivalent representations of the design structures and/or devices described above and shown in FIGS. 3-6. The design structures processed and/or generated by design flow 900 may be encoded on machine-readable transmission or storage media to include data and/or instructions that, when executed or otherwise processed on a data processing system, generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For examples, machines may include: lithography machines, machines and/or equipment for generating mask (e.g., e-beam writers), computers or equipment for simulating design structures, any apparatus used in the manufacturing or test process, or any machines for programming functionally equivalent representations of the design structures into any medium (e.g., a machine for programming a programmable gate array. In some embodiments of the invention, a machine readable storage medium is provided. In yet other embodiments of the invention, a machine readable non-transitory tangible medium is provided.

Design flow 900 may vary depending on the type of representation being designed. For example, a design flow 900 for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 7 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium, which is a machine readable non-transitory tangible medium, or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-6. In one embodiment, design structure 990 may comprise a compiled, executable HDL simulation model that functionally simulates the devices shown in FIGS. 3-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-6. Design structure 990 may then proceed to a stage 995 where, for example, design structure 990: proceeds to tape-out, is released to manufacturing, is released to a mask house, is sent to another design house, is sent back to the customer, etc.

While the present invention has been particularly shown and described with respect to various embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An anti-fuse structure comprising: a dielectric material having at least two adjacent conductive features embedded therein; at least one conductive material island located directly on an upper surface of said dielectric material and between the at least two adjacent conductive features; and a dielectric capping layer located on exposed surfaces of said dielectric material, said at least one conductive material island and said at least two adjacent conductive features, wherein when the anti-fuse structure is in a programmed state, a dielectric breakdown path is present in said dielectric material beneath the at least one conductive material island which conducts electrical current to electrically couple the two adjacent conductive features.

2. The anti-fuse structure of claim 1 further comprising an interconnect region laterally adjacent said anti-fuse structure, wherein said interconnect region is within a same interconnect level as said anti-fuse structure.

3. The anti-fuse structure of claim 1 wherein said dielectric material is located beneath a second dielectric material including a plurality of conductively filled regions embedded therein.

4. The anti-fuse structure of claim 1 wherein said dielectric material is located atop another dielectric material including a plurality of conductively filled regions embedded therein.

5. The anti-fuse structure of claim 1 wherein each of said at least one conductive material island is comprised of ruthenium (Ru), rhodium (Rh), palladium (Pd), silver (Ag), osmium (Os), iridium (Ir), platinum (Pt), gold (Au) or cobalt (Co).

6. The anti-fuse structure of claim 1 wherein said two adjacent conductive features are laterally adjacent to each other.

7. A structure comprising: at least one interconnect region and at least one laterally adjacent anti-fuse region located at a same interconnect level, wherein said at least one laterally adjacent anti-fuse region includes an anti-fuse structure, said anti-fuse structure comprising a dielectric material having at least two adjacent conductive features embedded therein, at least one conductive material island located directly on an upper surface of said dielectric material and between the at least two adjacent conductive features, and a dielectric capping layer located on exposed surfaces of said dielectric material, said at least one conductive material island and said at least two adjacent conductive features, wherein when the anti-fuse structure is in a programmed state, a dielectric breakdown path is present in said dielectric material that is located beneath said at least one conductive material island which conducts electrical current to electrically couple the two adjacent conductive features.

8. The structure of claim 7 wherein said dielectric material is located beneath a second dielectric material including a plurality of conductively filled regions embedded therein.

9. The structure of claim 7 wherein said dielectric material is located atop another dielectric material including a plurality of conductively filled regions embedded therein.

10. The structure of claim 7 wherein each of said conductive material islands is comprised of ruthenium (Ru), rhodium (Rh), palladium (Pd), silver (Ag), osmium (Os), iridium (Ir), platinum (Pt), gold (Au) or cobalt (Co).

11. A design structure tangibly embodied in a machine readable device for designing, manufacturing, or testing an integrated circuit, the design structure comprising: a dielectric material having at least two adjacent conductive features embedded therein; at least one conductive material island located directly on an upper surface of said dielectric material and between the at least two adjacent conductive features; and a dielectric capping layer located on exposed surfaces of said dielectric material, said at least one conductive material islands and said at least two adjacent conductive features.

12. The design structure of claim 11 wherein the design structure includes a netlist.

13. The design structure of claim 11 wherein the design structure resides on a storage medium as a data format used for the exchange of layout data of integrated circuits.

14. A method of forming an anti-fuse structure comprising: forming a dielectric material having at least two adjacent conductive features that are electrically and physically isolated from each other; forming at least one conductive material island directly on an upper surface of said dielectric material and between the at least two adjacent conductive features; and forming a dielectric capping layer located on exposed surfaces of said dielectric material, said at least one conductive material island and said at least two adjacent conductive features.

15. The method of claim 14 wherein said forming the at least one conductive material island includes providing a metal selected from the group consisting of ruthenium (Ru), rhodium (Rh), palladium (Pd), silver (Ag), osmium (Os), iridium (Ir), platinum (Pt), gold (Au), and cobalt (Co), and depositing the metal, said depositing includes chemical vapor deposition, plasma enhanced chemical vapor deposition, atomic layer deposition, electroplating and electroless plating.

16. The method of claim 14 wherein said forming the at least one conductive material island further forms a layer of conductive material on an upper surface of each of the at least two adjacent conductive features.

17. A method of programming an anti-fuse structure comprising: providing an anti-fuse structure including a dielectric material having at least two adjacent conductive features embedded therein, at least one conductive material island located directly on an upper surface of said dielectric material and between the at least two adjacent conductive features, and a dielectric capping layer located on exposed surfaces of said dielectric material, said at least one conductive material island and said at least two adjacent conductive features; and applying a voltage to said anti-fuse structure, wherein said voltage causes a dielectric breakdown path to form in said dielectric material that is located beneath said at least one conductive material island which conducts electrical current to electrically couple the two adjacent conductive features.

* * * * *